United States Patent
Milani et al.

(10) Patent No.: US 7,142,025 B2
(45) Date of Patent: Nov. 28, 2006

(54) PHASE DIFFERENCE DETECTOR, PARTICULARLY FOR A PLL CIRCUIT

(75) Inventors: Enrico Temporiti Milani, Pavia (IT); Guido Gabriele Albasini, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 24 days.

(21) Appl. No.: 10/797,621

(22) Filed: Mar. 10, 2004

(65) Prior Publication Data
US 2004/0232947 A1  Nov. 25, 2004

(30) Foreign Application Priority Data
Mar. 14, 2003  (IT)  .......................... MI2003A0485

(51) Int. Cl.
*H03K 3/17*  (2006.01)
(52) U.S. Cl. ..................... 327/156; 327/12; 327/17
(58) Field of Classification Search ................ 327/1, 327/2, 3, 5, 6, 7, 8, 10, 12, 17, 146, 147, 327/154, 155, 156
See application file for complete search history.

(56) References Cited

U.S. PATENT DOCUMENTS

| | | | | |
|---|---|---|---|---|
| 3,710,140 A | * | 1/1973 | Volmerange | ................ 327/12 |
| 4,904,948 A | * | 2/1990 | Asami | .......................... 327/12 |
| 5,095,287 A | * | 3/1992 | Irwin et al. | ................. 331/1 A |
| 5,673,005 A | * | 9/1997 | Pricer | .......................... 331/1 R |
| 5,892,380 A | * | 4/1999 | Quist | .......................... 327/172 |
| 5,963,059 A | * | 10/1999 | Partovi et al. | ................ 327/12 |
| 6,605,935 B1 | * | 8/2003 | Nilsson | .................. 324/76.53 |
| 2004/0178834 A1 | * | 9/2004 | Lee | ............................. 327/156 |

\* cited by examiner

*Primary Examiner*—Timothy P. Callahan
*Assistant Examiner*—An T. Luu
(74) *Attorney, Agent, or Firm*—Lisa K. Jorgenson; Dennis M. de Guzman; Seed IP Law Group PLLC

(57) ABSTRACT

A phase difference detector adapted to generating a signal indicative of a phase difference between a first signal and a second signal, comprising: a first bistable element clocked by the first signal and having a first output signal, and a second bistable element clocked by the second signal and having a second output signal; means for determining the variation of the signal indicative of the phase difference, responsive to the first and second output signals, and a reset circuit having a first and a second inputs respectively connected to the first and second output signals and adapted to determine the resetting of the first and second bistable elements in response to the attainment of a respective prescribed state by the first and the second output signals. The first and second inputs of the reset circuit are substantially symmetrical to each other from the point of view of an input impedance associated to each of them.

20 Claims, 3 Drawing Sheets

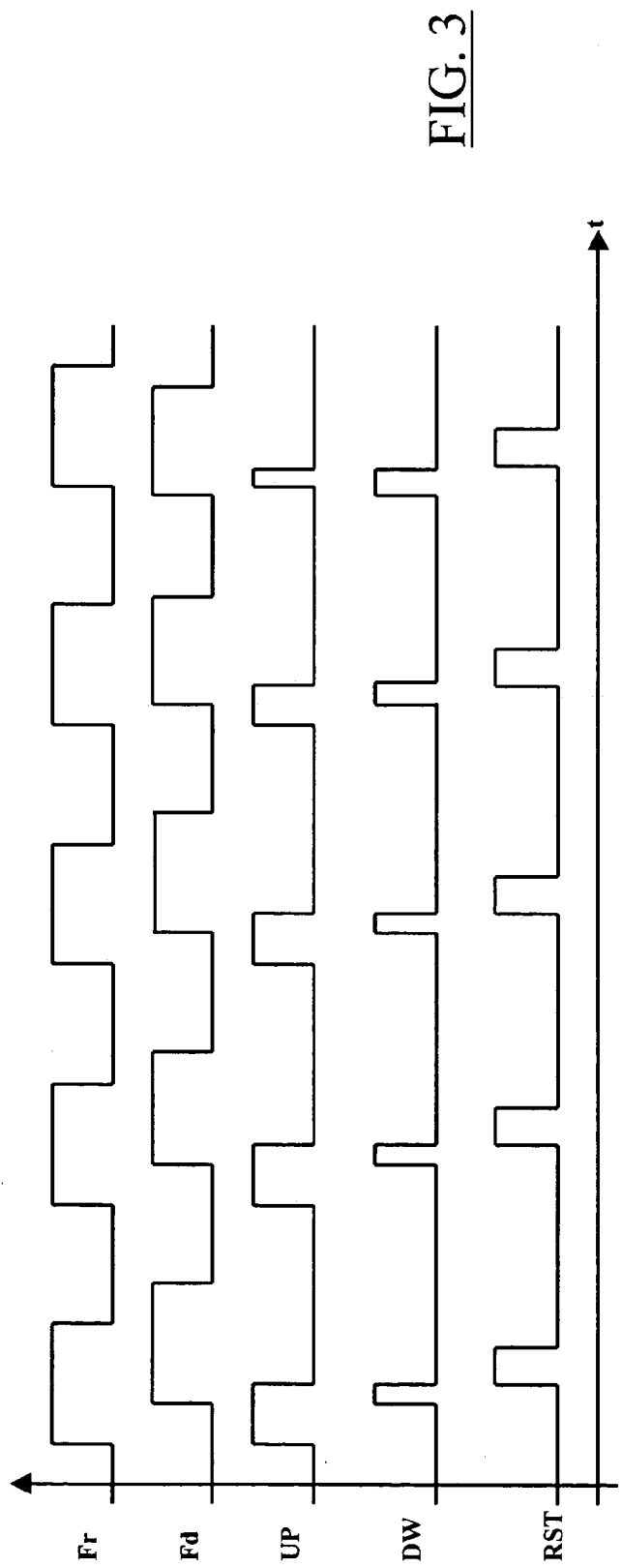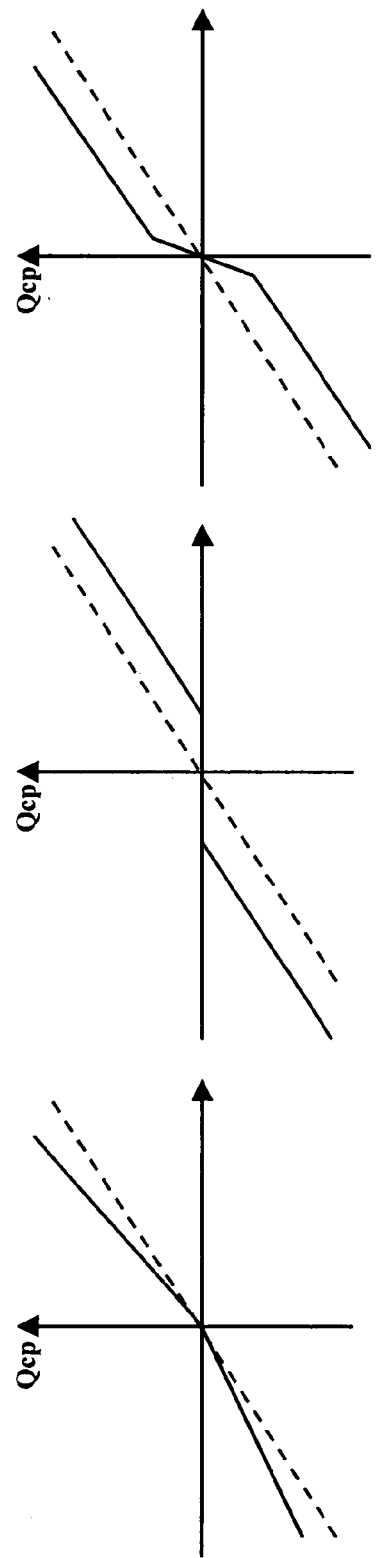

PHASE DIFFERENCE DETECTOR, PARTICULARLY FOR A PLL CIRCUIT

BACKGROUND OF THE INVENTION

1. Field of the Invention

The present invention relates in general to phase difference detector circuits, particularly of the type employed in Phase-Locked Loop (PLL) circuits.

2. Description of the Related Art

PLL circuits are largely exploited in several different applications; for instance, in the field of telecommunications, PLL circuits are used for realizing frequency synthesizers.

As known, the PLL is a circuit with negative feedback that allows obtaining, starting from a reference signal having a given frequency, or reference frequency, a signal having frequency equal to the reference frequency multiplied by a prescribed multiplication factor.

More particularly, a PLL circuit includes an phase difference detector adapted to detect the phase difference between the reference signal and a feedback signal, derived from the output signal of the PLL circuit through a feedback network comprising a frequency divider; the division factor implemented by the frequency divider corresponds to the aforesaid multiplication factor. The phase difference detector, typically constituted by a phase and frequency detector followed by a charge pump circuit, produces a signal, for instance a current signal, proportional to the detected phase difference. Such signal, filtered by a loop filter with transfer function such as to eliminate the high frequency components, for example a signal that is integrated and converted into a voltage signal, constitutes the control signal of a voltage controlled oscillator, that generates the output signal of the PLL circuit.

The PLL circuit is capable of producing signals with frequency equal to a multiple of the frequency of the reference signal. Varying the multiplication factor, and thus the division factor of the frequency divider in feedback network, it is possible to generate signals of different frequencies, in the art referred to as "channels".

PLL circuits are known in which the frequency multiplication factor N is an integer. The performances of these PLL circuits, denominated integer N PLL circuits, derive from a compromise in the choice of the design parameters, particularly as far as the bandwidth, the settling time, the distance (in frequency) between the different channels or resolution, the phase noise and the consumption are concerned.

These limitations are overcome by the so-called fractional N PLL circuits, that allow achieving non-integer multiplication factors of the reference frequency. Particularly, for a same distance between the different channels, the fractional N PLLs are characterized by a reduced phase noise compared to the integer N PLLs.

In order to obtain a fractional multiplication factor, given a generic channel, the division factor of the frequency divider in the feedback network is made to vary dynamically between two integer values, for instance two consecutive integer values N and N+1, with a given periodicity. This technique allows generating signals whose frequency is equal to non-integer multiples of the frequency of the reference signal.

One of the main disadvantages of the fractional N PLL circuits consists in the generation of spurious signals. Particularly, such spurious signals are generated in consequence of the periodic variation of the frequency division factor, from N to N+1. The spurious signals are found at frequencies differing from the reference frequency of multiples of the frequency with which the frequency division factor is made to vary.

A known technique for limiting the effect of the spurious signals consists in using a $\Sigma\Delta$ modulator for controlling the instantaneous frequency division factor of the frequency divider.

The level of the spurious signals is increased by the presence of inevitable nonlinearities in the PLL loop, and particularly in the phase difference detector. Particularly, the nonlinearities in the input-output characteristic of such subsystem of the PLL determines an increase in the level of the spurious signal situated at the fractional frequency equal to the product of the reference frequency for the selected channel divided by the overall number of channels. The level of such spurious signal is particularly high for that channels that are characterized by a fractional frequency lower than the loop bandwidth, because of the limited filtering band of the loop filter.

In B. De Muer et al., "A CMOS Monolithic $\Sigma\Delta$-Controlled Fractional-N Frequency Synthesizer for DCS-1800", IEEE JSSC, No. 7, July 2002, pages 835 to 844, it is underlined that the nonlinearities in the input-output characteristic of the phase difference detector are the main cause of spurious signals, and thus an optimization of the phase and frequency detector and of the charge pump circuit is desirable. Particularly, the authors of such article indicates two types of nonlinearity: a dead zone present in the input-output characteristic for small phase difference values, and a different gain for positive and negative phase differences, consequence of the mismatches in the current generators that serve to generate the current signal proportional to the phase difference.

The Applicant has observed that eliminating the two aforementioned types of nonlinearity does not allow reducing enough the level of the spurious signals.

BRIEF SUMMARY OF THE INVENTION

In view of the state of the art outlined, it has been therefore an object of the present invention to improve the performances of the phase difference detectors, so as to improve the spectral purity characteristics of the output signal of a PLL circuit, and particularly of a fractional N PLL circuit.

More specifically, it has been an object of the present invention to improve the linearity of the response of the phase difference detector.

The Applicant has observed that, once the above described nonlinearities are eliminated or substantially reduced, a further nonlinearity remains in the input-output characteristic of the phase difference detector; the Applicant has also observed that such further nonlinearity is mainly due to the non-symmetrical variation of nonlinear impedances that load particular internal signals to the phase difference detector.

According to the present invention, with the purpose of eliminating or substantially reducing such further nonlinearities, a phase difference detector is provided adapted to generate a signal indicative of a phase difference between a first signal and a second signal, comprising a first bistable element clocked by the first signal and having a first output signal, a second bistable element clocked by the second signal and having a second output signal, means adapted to determine the variation of said signal indicative of the phase difference according to said first and second output signals, and a reset circuit having a first and a second inputs respectively connected to said first and second output signals and adapted to cause the reset of the first and the second bistable elements responsive to the reaching of a respective prescribed state by the first and of the second output signals.

Said first and second inputs of the reset circuit are substantially symmetrical to each other from the point of view of an input impedance associated with each every of them.

BRIEF DESCRIPTION OF THE SEVERAL VIEWS OF THE DRAWING(S)

These and other features and the advantages of the present invention will be made apparent by the following detailed description of some embodiments thereof, provided purely by way of non limitative examples, that will be done making reference to the attached drawings, wherein:

FIG. 3 is a time diagram illustrative of the operation of the phase difference detector of FIG. 2;

Figure 5:
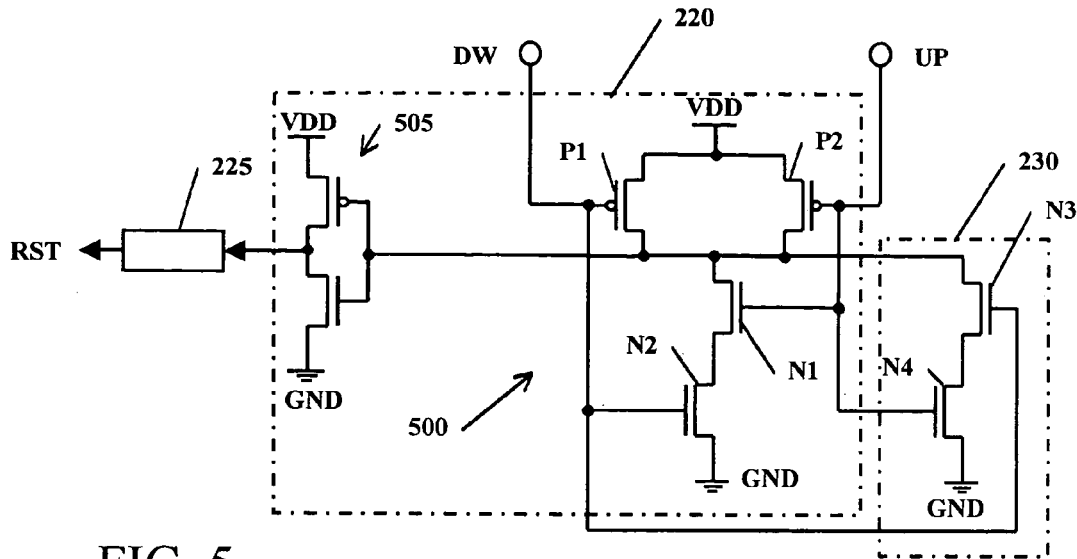
Figure 6:
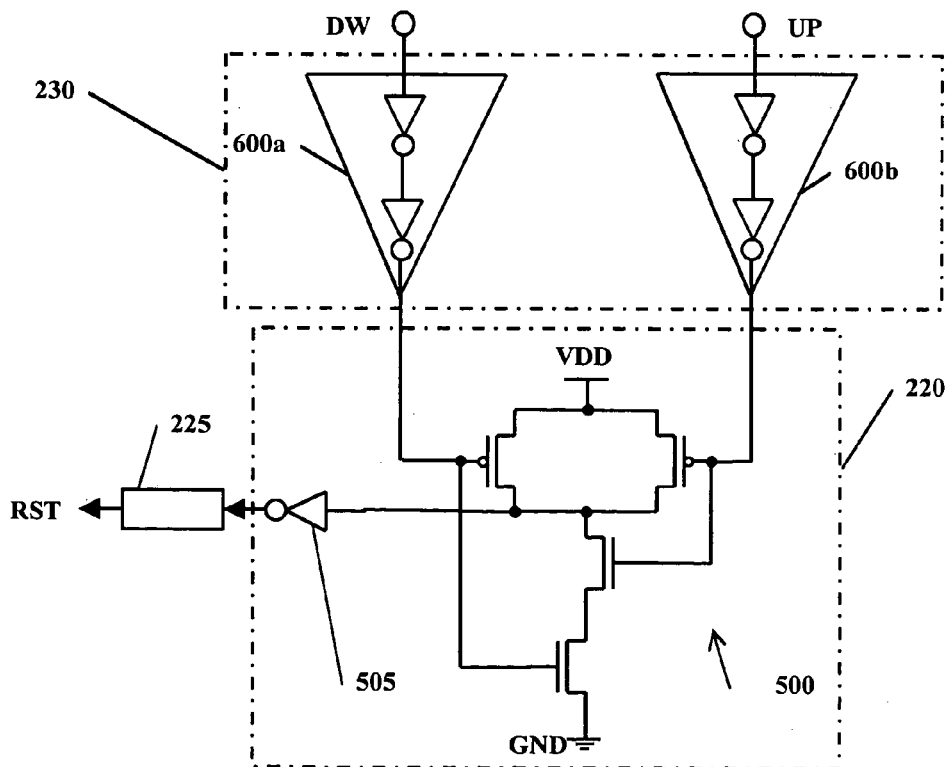

FIGS. 4A, 4B and 4C schematically show three different types of nonlinearity that affect the response of a conventional phase difference detector; and FIGS. 5 and 6 show two possible embodiments of a linearization circuit element for linearizing the response of the phase difference detector.

DETAILED DESCRIPTION OF THE INVENTION

Figure 1:
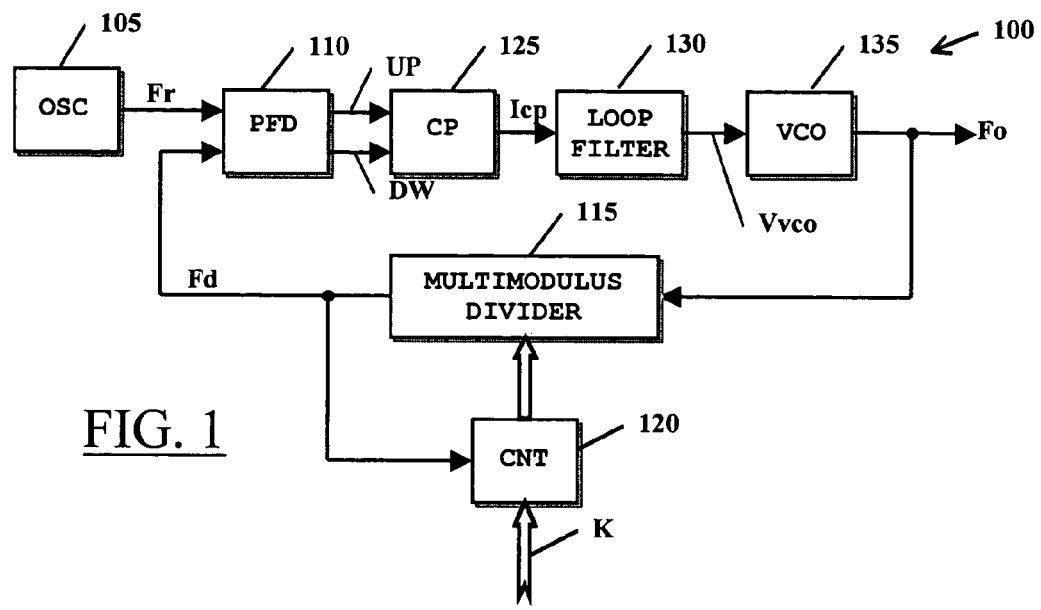
FIG. 1 is a functional block diagram of a PLL, particularly a fractional N PLL.

With reference to the drawings, in FIG. 1 the functional block diagram of a PLL circuit 100 is shown, particularly a digital PLL circuit and more particularly, but not limitatively, a fractional N PLL circuit, of the type used in frequency synthesizer circuits for synthesizing an output signal Fo having a prescribed frequency Fo starting from a reference signal Fr having a reference frequency Fr, in general different from the frequency Fo that is desired to achieve. The frequency Fo of the output signal Fo is also referred to as a channel of the PLL circuit.

The reference signal Fr is typically generated by an oscillator 105, for instance a quartz crystal oscillator, adapted to provide a basic clock signal relatively stable and precise infrequency; typically, the reference signal Fr fed to the PLL circuit is derived from the signal generated by the quartz crystal oscillator, properly scaling in frequency this last signal.

The reference signal Fr is fed to a first input of a phase and frequency comparator 110; a second input of the phase and frequency comparator receives a feedback signal Fd, generated by a frequency divider 115 starting from the output signal Fo.

The frequency divider 115 is a multimodulus divider, whose division factor is made to dynamically vary in such way that the signal Fd has, on average, a frequency equal to a non-integer fraction of the frequency Fo of the output signal Fo. Particularly, the multimodulus frequency divider 115 is controlled by a control circuit 120 that determines the instantaneous value of the division factor; in an exemplary and non-limitative embodiment of the present invention, the control circuit 120 includes a delta-sigma modulator ($\Delta\Sigma$), that receives in turn a digital code K adapted to define the division factor of the frequency Fo.

The phase and frequency comparator 110 compares the signals Fr and Fd to each other, with the purpose of determining their phase difference.

The phase and frequency comparator 110 controls a charge pump circuit 125 through a pair of signals UP and DW, whose activation by the phase and frequency comparator 110 is selective and depends on the detected phase difference between the signals Fr and Fd.

The charge pump circuit 125 generates a current signal Icp, whose value is indicative of the difference in frequency between the two signals Fr and Fd.

The current signal Icp generated by the charge pump circuit 125 is injected into a loop filter 130, of suitable spectral characteristics, for removing the high frequency components from the current signal Icp.

The loop filter 130 integrates the signal Icp and generates a voltage signal Vvco.

The voltage signal Vvco acts as a control voltage for a voltage controlled oscillator circuit (VCO) 135, that outputs the signal Fo.

In operation, the VCO 135 initially oscillates at a free oscillation frequency, consequence of the background noise in the PLL circuit. Supposing that the regulation value K is equal to 0, the circuit behaves as an integer division factor PLL. In this case, the frequency divider 115 always divides the frequency of the output signal Fo by the same integer number N, and therefore it results Fd=Fo/N.

In an unlocked condition (as at the power-up, or immediately after a channel switching), the frequency of the signal Fd is different from the frequency Fr of the reference signal Fr; such frequency difference is detected by the phase and frequency comparator 110, and the charge pump circuit generates a correspondent current signal Icp. The control voltage Vvco causes the frequency of the output signal Fo to vary. Particularly, if the frequency of the signal Fd is lower than the frequency of the reference signal Fr, the control voltage Vvco is such as to cause an increase in frequency of the output signal Fo; on the contrary, if the frequency of the signal Fd is higher than the frequency of the reference signal Fr, the control voltage Vvco is such as to determine a decrease of the frequency of the output signal Fo.

A similar behavior is observed if the two signals Fd and Fr are out of phase: in this case the PLL tends to bring the signal Fd in phase locked condition with the signal Fr.

After a transient, the frequency of the signal Fd reaches the frequency Fr of the reference signal Fr. In this condition, referred to as locked condition, the frequency Fo of the output signal is therefore equal to Fr*N, i.e., to an integer multiple of the frequency Fr of the reference signal. The frequency Fo of the output signal Fo can be therefore regulated (in an interval of interest) with a precision, or inter-channel distance, equal to the frequency Fr of the reference signal Fr.

As known, an inevitable consequence of the process described above is that the frequency multiplication process carried out by the PLL 100 causes the phase noise of the output signal Fo to increase quadratically with the value N; therefore, the integer number N should be kept relatively low; the distance among the channels is thus increased accordingly.

Such drawback is resolved thanks to the so-called fractional architecture, in which, in locked conditions, the division factor of the frequency divider 115 is made to vary dynamically. Particularly, considering for instance a bimodulus frequency divider, the division factor is made to vary dynamically between an integer value N and an integer value N+1: given a number F of cycles of the feedback signal Fd, with K<F, the division factor of the frequency divider 115 is equal to N+1 for a number K of times, and it is equal to N for the remaining (F−K) times. An average division factor on the F cycles is thus obtained, equal to N+K/F. Accordingly, in locked conditions, the frequency Fo of the output signal Fo is equal to (N+K/F)Fr, the value K/F defines a fractional channel, which corresponds to a respective frequency of the output signal.

The delta-sigma modulator 120 can be of the multibit type, and in this case it is possible to use a multimodulus frequency divider, in which the frequency division factor can take more than two different integer values.

The fractional architecture allows to synthesize output signals with frequency equal to a non-integer multiple of the frequency of the reference signal Fr; therefore, the frequency of the reference signal Fr can be greater than the distance between the channels, and it is thus possible to reduce the integer number N. The performances of the PLL 100 in terms of phase noise are improved.

Figure 2:
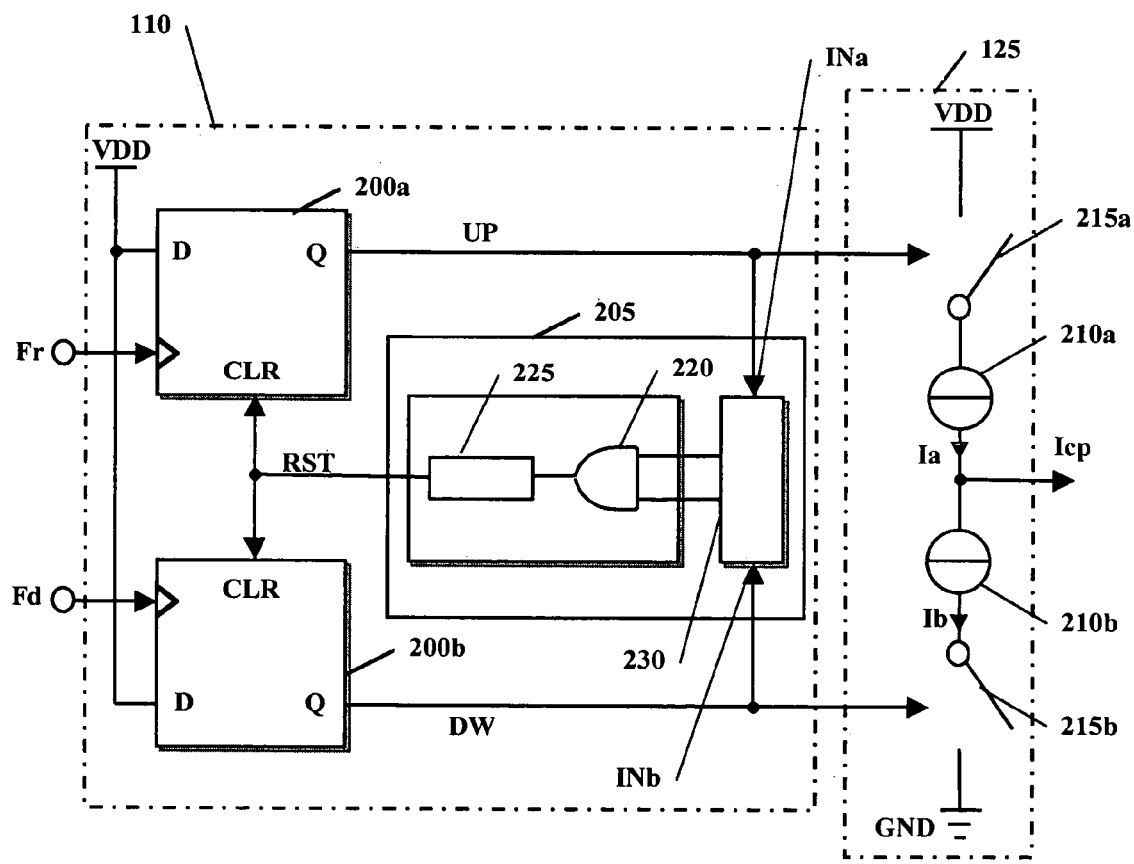
FIG. 2 is a more detailed functional block diagram of a phase difference detector subassembly of the PLL, in an embodiment of the present invention.

In FIG. 2 there are shown in greater detail the phase and frequency comparator 110 and the charge pump circuit 125, in an embodiment of the present invention. Such blocks constitute, altogether, a phase difference detector. The phase and frequency detector 110 is a circuit adapted to detect phase differences between the signals Fr and Fd smaller than +/−2π or greater than +/−2π. The name "phase and frequency detector" stems from the fact that, when the phase difference between the signals Fr and Fd is smaller than +/−2π, the detector 110 is considered to operate as a phase detector, while when the phase difference is greater than +/−2π, the detector 110 is considered to operate as a frequency detector.

Particularly, the reference signal Fr is fed to the clock input of a first D-type flip-flop 200a; the input D of the flip-flop 200a is connected to a supply voltage line VDD (equal for instance to 5V). In similar way, the signal Fd is fed to the clock input of a second D-type flip-flop 200b; the input D of the flip-flop 200b is connected to the supply voltage line VDD.

The output Q of the flip-flop 200a and the output Q of the flip-flop 200b form the drive signals UP and DW, respectively, for the charge pump circuit. As shown in FIG. 2, the charge pump circuit 125 can be schematized as comprising a first and a second current generators 210a, 210b, each of which is adapted to generate a respective current Ia, Ib. The current generator 210a is put in series to a switch 215a controlled by the signal UP; the current generator 210b is put in series to a switch 215b controlled by the signal DW. The closing of the switch 215a causes the current generator 210a to inject the current Ia into the loop filter 130; likewise, the closing of the switch 215b causes the current generator 210b to absorb the current Ib from the loop filter 130.

In practice, the switches 215a and 215b can be realized through MOSFET, driven by the signals UP and DW; for instance, a P-channel MOSFET, driven by the signal UP (properly reversed by the point of view of the logic state) is used for realizing the switch 215a and an N-channel MOSFET, driven by the signal DW, is used for realizing the switch 215b. The current generators 210a and 210b can be realized again by means of MOSFETs, arranged to form current mirror structures.

It is observed that, in alternative, the signals UP and DW can be constituted by the outputs Q# of the flip-flops 200a, 200b, complementary to the outputs Q, or one of the two signals UP and DW can be constituted by the output Q of one of the two flip-flops 200a and 200b, while the other signal can be constituted by the complementary output Q# of the other flip-flop. Suitable logic state inversions can become necessary to drive the MOSFETs of the charge pump circuit.

The signals UP and DW are also fed to respective inputs of a reset circuit 205 for resetting the flip-flops 200a and 200b. The reset circuit 205 detects the state of the signals UP and DW and, depending on the detected state, it controls an output signal RST, that is fed to the reset ("clear") inputs CLR of the flip-flops 200a and 200b, to determine the reset thereof.

Making reference to the simplified timing diagram of FIG. 3, at every rising edge of the reference signal Fr the flip-flop 200a loads the logic state ("1") present on the respective input D, thereby the output UP is brought into the logic state "1". Likewise, at every rising edge of the signal Fd, the flip-flop 200b loads the logic state ("1") present on the respective input D, thereby the output DW is brought into the logic state "1". From a logic state point of view, the reset circuit 205 substantially behaves as an AND gate 220: as long as at least one of the signals UP and DW is de-asserted (i.e., it is in the logic state "0"), the reset circuit 205 keeps the reset signal RST in a de-asserted state (in the example, corresponding to the logic state "0"); when both the signals UP and DW are in the logic state "1", the reset circuit 205 asserts the reset signal RST, thereby determining the resetting of the flip-flops 200a and 200b and, accordingly, the return to the logic state "0" of the two signals UP and DW. The signals UP and DW remain in the logic state "0" until the following rising edge of the signal Fr and, respectively, of the signal Fd occurs.

As it is possible to notice from FIG. 3, the signal UP remains in the logic state "1" (adapted to cause the closing of the switch 215a, and therefore the activation of the current generator 210a) for a time that depends on the phase delay of the signal Fd compared to the reference signal Fr; the current Ia delivered by the current generator 210a will tend to make the value of the control voltage Vvco of the VCO 135 progressively increase, whereby the frequency of the output signal Fo increases, and thus the frequency of the signal Fd derived therefrom, so as to reduce the phase delay with respect to the reference signal Fr.

Conversely, the signal DW remains in the logic state "1" (adapted to determine the closing of the switch 215b, and therefore the activation of the current generator 210b) for a time dependent on the phase lead of the signal Fd compared to the reference signal Fr; the current Ib delivered by the current generator 210b will tend to make the value of the control voltage Vvco of the VCO 135 progressively decrease, so as to decrease the frequency of the output signal Fo, and therefore the frequency of the signal Fd derived therefrom, so as to reduce the phase lead with respect to the reference signal Fr.

As mentioned in the introductory part of the present description, an important aspect for the purposes of the performances of the PLL circuit is the linearity of the input-output characteristic of the phase difference detector, i.e., of the subassembly constituted by the phase and frequency detector 110 and the charge pump circuit 125; such characteristic is the function that links the output electric charge Qcp of the charge pump circuit 110 to the phase difference Δφ between the signals Fr and Fd. If the phase and frequency detector 110 and the charge pump circuit 125 were ideal, such characteristic would be perfectly linear. In practice, nevertheless, the non-ideality of the phase and frequency detector 110 and of the charge pump circuit 125 causes non-linearities to arise in such input-output characteristic.

A first type of nonlinearity, already recognized in literature (for instance, in the already cited article of De Muer et al.), is schematically shown in FIG. 4A, in which the ideal characteristic is represented in dashed line. This first type of nonlinearity, consisting in a different slope of the characteristic output charge Qcp versus phase difference Δϕ for negative or positive phase difference values, is caused by the inevitable mismatch between the current generators 210a and 210b, and therefore by the difference between the currents Ia and Ib which they deliver. As already mentioned, in the practice the charge pump circuit is realized by means of MOSFETs, for instance a P-channel MOSFET P, controlled by the signal UP (properly inverted) to enable the current generator Ia and an N-channel MOSFET, controlled by the signal DW, to enable the current generator Ib, and the current generators are realized through structures of MOSFETs arranged to form current mirrors; the inevitable differences between the MOSFETs, particularly those that form the current mirror structures, for instance in terms of area and gain, translates into a difference in the currents Ia and Ib, and such a current difference causes the first type of nonlinearity: a difference of gain of the phase difference detector for positive and negative phase differences. In order to eliminate this nonlinearity, it is possible to provide for a regulation, or trimming, of the current Ia delivered by the generator 210a, or of the current Ib absorbed by the generator 210b, or of both; such a regulation can be implemented through a manual regulation or by means of an automatic trimming.

A second type of nonlinearity, also already recognized in literature and schematically shown in FIG. 4B (in which, as in FIG. 4A, the ideal characteristic is represented in dashed line), consists in a so-called dead zone present in the characteristic Qcp–Δϕ in correspondence of values of the phase difference Δϕ close to zero. Such nonlinearity is eliminated by providing, in the reset circuit 205, for instance downstream the logic AND gate 220, an element 225 adapted to introduce a prescribed time delay in the reset path of the flip-flops 200a and 200b; such delay element can be for instance practically realized through a chain of inverting buffers (for instance, simple CMOS inverters) or non-inverting. In this way, both the current generators 210a and 210b result active for values of phase difference between the signals Fr and Fd around the zero, and the phase difference detector is able to react also to very small phase errors.

The Applicant has nevertheless observed that, once the above described nonlinearities are eliminated or substantially reduced, a further nonlinearity remains in the input-output characteristic of the phase difference detector. Particularly, the Applicant has observed that, once the gains for positive and negative phase differences are made substantially equal, and the dead zone in proximity of the origin is eliminated, the characteristic Qcp–Δϕ exhibits a residual nonlinearity; for instance, as schematically shown in FIG. 4C (in which, as in the preceding FIGS. 4A and 4B, the ideal characteristic is again represented in dashed line) in an interval of values of the phase difference Δϕ relatively close to zero, the Applicant has observed that the characteristic Qcp–Δϕ exhibits a significantly higher slope compared to the slope that the characteristic Qcp–Δϕ has for higher values of phase difference Δϕ (in absolute value).

The Applicant has observed that such further nonlinearity is mainly due to the non-symmetrical variation of the nonlinear impedances that load the outputs UP and DW of the phase and frequency detector 110, at the switching instants of such signals.

Particularly, the Applicant has observed that such nonlinearity is also present in the case in which the impedances of the two inputs of the charge pump circuit 125 are substantially symmetrical.

The Applicant has in fact ascertained that the known reset circuits 205 are realized in such a way that, when they undergo a switching, the signals UP and DW result to be loaded by nonlinear impedances variable in non-symmetrical way. For instance, making reference to FIG. 5, in the usual case in which the reset circuit 205 include a logic AND gate 220, the integration of such a logic gate in CMOS technology calls as known for the realization of a logic NAND gate 500 with a CMOS inverter 505 downstream. It can be appreciated that in such case the load impedances of the signals UP and DW are different from each other, due to the asymmetry of the circuit structure of the NAND gate. Particularly, while the two P-channel MOSFETs P1 and P2 of the NAND gate are connected in parallel to each other, the two N-channel MOSFETs N1 and N2 are connected in series; therefore, the capacitances seen by the signals UP and DW are not equal and do not vary symmetrically when such signals are switched.

According to an embodiment of the present invention, in order to eliminate or at least substantially reduce the residual nonlinearity caused by such phenomenon, for instance of the type shown in FIG. 4C, an element 230 is provided in the reset circuit 205 adapted to render substantially symmetrical the load impedances of the signals UP and DW that constitute the inputs of the reset circuit 205. Particularly, in an embodiment of the present invention, the symmetrization element 230 is a circuit block placed upstream the traditional reset circuit (comprising for instance a logic gate, for example an AND gate and a delay line), and having a pair of inputs INa, INb associated with respective input impedances symmetrical to each other. For instance, the symmetrization element 230 is placed upstream of the logic AND gate 220.

The symmetrization element 230 can be practically realized in several ways.

For example, with reference to FIG. 5, the symmetrization element 230 may comprise a circuit structure such that, combined with the traditional circuit structure of CMOS logic NAND gate, gives origin to a symmetrical logic NAND gate; particularly, in an embodiment of the present invention, the symmetrization element 230 includes a circuit branch comprising two N-channel MOSFET N3 and N4, substantially identical to the MOSFETs N1 and N2 of the CMOS NAND gate 500, connected in series to each other and, altogether, connected in parallel to the MOSFETs N1 and N2. The MOSFET N4, adjacent to the ground GND, is driven by the same signal, UP in the shown example, that drives the MOSFET N1, farther from the ground; likewise, the MOSFET N3, farther from the ground, is driven by the same signal, DW in the example, that drives the MOSFET N2 adjacent the ground. The structure that is obtained is thus symmetrical, and symmetrical are therefore the load impedances of the signals UP and DW.

It is observed that, in an entirely similar way, in the case in which the reset circuit 205 includes an OR gate rather than an AND gate (for example, in the case in which the signals UP and DW are constituted by the outputs Q# of the flip-flops 200a, 200b, complementary to the outputs Q), the symmetrization element will include a circuit branch with two channel P-MOSFET in series, and connected in parallel to the series of the two P-channel MOSFET of the CMOS OR gate.

Alternatively, the symmetrization element 230 can be a circuit block adapted to decouple the signals UP and DW from the asymmetrical impedance inputs of a conventional reset circuit, for instance from the inputs of the CMOS AND gate 220. For Example, as shown in FIG. 6, the symmetrization block 230 can include a first and a second not-inverting buffers 600a, 600b (for instance realized through two cascaded CMOS inverters), having input impedances substantially identical to each other, between the signal UP and DW and a respective input of the CMOS AND gate 220.

The present invention finds in particular application in fractional-N PLLs, that are very sensitive to the nonlinearities of the subsystem constituted by the phase and frequency detector and charge pump; nevertheless, the invention can be also applied to integer-N PLLs.

The present invention has been described here in terms of some possible embodiments thereof. It is clear that those skilled in the art can bring several changes to the embodiments described, as well as conceive other embodiments of the present invention, without for this reason departing from the scope of the invention defined in the appended claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A phase difference detector adapted to generate a phase difference signal indicative of a phase difference between a first signal and a second signal, comprising:
   a first bistable element clocked by the first signal and having an output terminal to provide a first output signal;
   a second bistable element clocked by the second signal and having an output terminal to provide a second output signal;
   means for determining a change of said phase difference signal, responsive to said first and second output signals;
   a reset circuit having first and second input terminals respectively connected to receive said first and second output signals and adapted to determine a resetting of the first and the second bistable elements responsive to an attainment of a respective prescribed state of the first and the second output signals, said first and second input terminals of the reset circuit substantially symmetrical to each other from a point of view of a respective input impedance associated with each of them; and
   a symmetrization element coupled to the output terminals of the first and second bistable elements, the symmetrization element including first and second transistors, the first transistor having a control terminal coupled to the output terminal of the first bistable element and having a first terminal, the second the transistor having a control terminal coupled to the output terminal of the second bistable element and having a first terminal coupled to the first terminal of the first transistor.

2. The phase difference detector of claim 1 wherein the reset circuit includes, associated with said first and second input terminals, input impedance symmetrization means that comprise part of the symmetrization element.

3. The phase difference detector of claim 2 wherein the reset circuit includes a logic circuit with a first logic input terminal and a second logic input terminal, respectively coupled to receive the first and the second signals and adapted to detect the attainment of the respective prescribed state by the first and the second output signals, and wherein said symmetrization means are associated with said first and second logic input terminals.

4. The phase difference detector of claim 3 wherein said symmetrization means include decoupling means of the first and second input terminals of the reset circuit from the first and second logic input terminals, respectively.

5. A phase-locked loop circuit adapted to generate an output signal locked in frequency and phase to a reference signal, comprising:
   a phase difference detector adapted to detect a phase difference between the reference signal and a signal derived from the output signal, the phase difference detector including:
      a first bistable element clocked by the reference signal and having an output terminal to provide a first output signal;
      a second bistable element clocked by the derived signal and having an output terminal to provide a second output signal;
      means responsive to said first and second output signals for determining a change of a phase difference signal that is indicative of a phase difference between the reference signal and the derived signal;
      a reset circuit having first and second input terminals respectively connected to receive said first and second output signals and adapted to determine a resetting of the first and the second bistable elements responsive to an attainment of a respective prescribed state of the first and the second output signals, said first and second input terminals of the reset circuit substantially symmetrical to each other from a point of view of a respective input impedance associated with each of them; and
      a symmetrization element coupled to the output terminals of the first and second bistable elements, the symmetrization element including first and second transistors, the first transistor having a control terminal coupled to the output terminal of the first bistable element and having a first terminal, the second transistor having a control terminal coupled to the output terminal of the second bistable element and having a first terminal coupled to the first terminal of the first transistor; and
   an oscillator controlled by the phase difference signal generated by the phase difference detector.

6. The phase-locked loop circuit of claim 5, further comprising a frequency divider adapted to generate the derived signal through division in frequency of the output signal of the phase-locked loop circuit, said divider being controlled to implement a division factor equal to an integer number.

7. The phase-locked loop circuit of claim 5, further comprising a frequency divider adapted to generate the derived signal through division in frequency of the output signal of the phase-locked loop circuit, said divider being controlled to implement an average division factor equal to a non-integer number.

8. The phase-locked loop circuit of claim 5 wherein the first and second bistable elements comprise flip-flop devices.

9. A method for improving linearity characteristics of a response of a phase difference detector adapted to generate a signal indicative of a phase difference between a first signal and a second signal, the phase detector having a first bistable element clocked by the first signal and having a first output signal, a second bistable element clocked by the second signal and having a second output signal, a circuit block to determine a variation of said signal indicative of the phase difference, responsive to said first and second output signals, a reset circuit having a first and a second inputs respectively connected to receive the said first and second output signals and adapted to determine a resetting of the first and second bistable elements in response to an attainment of a respective prescribed state by the first and the second output signals, and a symmetrization element coupled to the first and second bistable elements, the symmetrization element including first and second transistors, the first transistor having a control terminal coupled to the output terminal of the first bistable element and having a first terminal, the second transistor having a control terminal coupled to the output terminal of the second bistable element and having a first terminal coupled to the first terminal of the first transistor, the method comprising:

making said first and second inputs of the reset circuit substantially symmetrical to each other from a point of view of an input impedance associated to each one of them by using the symmetrization element having said first and second transistors that have their first terminals coupled to each other and that have their control terminals respectively coupled to the output terminals of the first and second bistable elements.

10. A frequency synthesizer circuit, comprising:

a reference signal generator and a phase-locked loop circuitadapted to generate an output signal locked in frequency and phase to a reference signal, comprising:

a phase difference detector adapted to detect a phase difference between the reference signal and a signal derived from the output signal, the phase difference detector including:

a first bistable element clocked by the reference signal and having an output terminal to provide a first output signal;

a second bistable element clocked by the derived signal and having an output terminal to provide a second output signal;

a circuit block responsive to said first and second output signals to determine a change of a phase difference signal that is indicative of a phase difference between the reference signal and the derived signal;

a reset circuit having first and second input terminals respectively connected to receive said first and second output signals and adapted to determine a resetting of the first and the second bistable elements responsive to an attainment of a respective prescribed state of the first and the second output signals, said first and second input terminals of the reset circuit substantially symmetrical to each other from a point of view of a respective input impedance associated with each of them; and a symmetrization element coupled to the output terminals of the first and second bistable elements, the symmetrization element including first and second transistors, the first transistor having a control terminal coupled to the output terminal of the first bistable element and having a first terminal, the second transistor having a control terminal coupled to the output terminal of the second bistable element and having a first terminal coupled to the first terminal of the first transistor; and an oscillator controlled by the phase difference signal generated by the phase difference detector.

11. The frequency synthesizer circuit of claim 10 wherein the first and second bistable elements comprise flip-flop devices.

12. The frequency synthesizer circuit of claim 10, further comprising a delay device coupled to the symmetrization element to provide a delay to the first and second bistable elements.

13. A phase difference detector, comprising:

a first logic element having an input terminal coupled to receive a first clock signal and having an output terminal;

a second logic element having an input terminal coupled to receive a second clock signal and having an output terminal;

a feedback circuit having two input terminals and an output terminal, a first input terminal being coupled to the output terminal of the first logic element and a second input terminal being coupled to the output terminal of the second logic element, the feedback circuit further including a logic gate coupled to the first and second output terminals from the first and second logic elements;

a feedback line coupled from the output terminal of the feedback circuit to a control input terminal in each of the first and second logic elements;

a phase correction circuit coupled to the output terminal of the first logic element and to the output terminal of the second logic element, the phase correction circuit having an output terminal to provide a phase correction signal; and a symmetrization element coupled to the output terminals of the first and second logic elements, wherein the symmetrization element includes first and second transistors, the first transistor having a control terminal coupled to the output terminal of the first logic element and having a first terminal, the second transistor having a control terminal coupled to the output terminal of the second logic element and having a first terminal coupled to the first terminal of the first transistor.

14. The circuit according to claim 13 wherein the feedback circuit includes a delay circuit that provides a timed delay to the control input terminals of the first and second logic elements.

15. The circuit according to claim 13 wherein at least one of the control input terminals is a feed back terminal.

16. A phase difference detector apparatus, comprising:

a first element having an input terminal coupled to receive a first clock signal and having an output terminal and a control input terminal;

a second element having an input terminal coupled to receive a second clock signal and having an output terminal and a control input terminal;

a feedback circuit having two input terminals and an output terminal, a first input terminal being coupled to the output terminal of the first element and a second input terminal being coupled to the output terminal of the second element, the output terminal of the feedback circuit being coupled to a control input terminal in each of the first and second elements;

a phase correction circuit coupled to the output terminal of the first element and to the output terminal of the second element, the phase correction circuit having an output terminal to provide a phase correction signal; and a symmetrization element coupled to the output terminals of the first and second elements, the symmetrization element including first and second transistors, the first transistor having a control terminal coupled to the output terminal of the first element and having a first terminal, the second transistor having a control terminal coupled to the output terminal of the second element and having a first terminal coupled to the first terminal of the first transistor.

17. The apparatus of claim 16, further comprising a delay circuit to provide a timed delay to the control input terminals of the first and second elements.

18. The apparatus of claim 16 wherein the first and second elements comprise flip-flop devices.

19. The apparatus of claim 16 wherein the feedback circuit includes a logic element having at least one input terminal coupled to an output terminal of the symmetrization element and an output terminal coupled to the control input terminals of the first and second elements.

20. The apparatus of claim 16, further comprising phase-locked loop means included along with the phase difference detector apparatus for realizing a frequency synthesizer.

* * * * *